US006617086B2

(12) United States Patent
Angelopoulos et al.

(10) Patent No.: US 6,617,086 B2
(45) Date of Patent: Sep. 9, 2003

(54) FORMING A PATTERN OF A NEGATIVE PHOTORESIST

(75) Inventors: Marie Angelopoulos, Cortlandt Manor, NY (US); Edward D. Babich, Chappaqua, NY (US); Inna V. Babich, Chappaqua, NY (US); Katherina E. Babich, Chappaqua, NY (US); James J. Bucchignano, Yorktown, NY (US); Karen E. Petrillo, Mahopac, NY (US); Steven A. Rishton, Hayward, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/796,445

(22) Filed: Mar. 2, 2001

(65) Prior Publication Data

US 2002/0123010 A1 Sep. 5, 2002

Related U.S. Application Data

(62) Division of application No. 09/373,555, filed on Aug. 3, 1999, now Pat. No. 6,251,569.

(51) Int. Cl.[7] .............................. G03C 3/00; G03F 7/30
(52) U.S. Cl. ...................... 430/17; 430/18; 430/270.1; 430/910
(58) Field of Search .............................. 430/325, 270.1, 430/910, 18, 17

(56) References Cited

U.S. PATENT DOCUMENTS

| 4,284,707 | A |   | 8/1981  | Nagasawa et al. | 430/196   |
|-----------|---|---|---------|-----------------|-----------|
| 4,603,195 | A |   | 7/1986  | Babich et al.   | 534/564   |
| 5,225,316 | A | * | 7/1993  | Vogel et al.    | 430/270.1 |
| 5,939,242 | A | * | 8/1999  | Tang et al.     | 430/329   |
| 5,994,025 | A | * | 11/1999 | Iwasa et al.    | 430/270.1 |

OTHER PUBLICATIONS

Thompson et al, Molecular parameters and lithographic performance of poly(glycidyl methacrylate–co–ethyl acrylate): A negative electron resist, *J. Vac. Sci. Technol.*, 12 (6), Nov./Dec. 1975: 1280–1283.

Hirai et al, Epoxide–Containing Polymers as Highly Sensitive Electron–Beam Resists, *Electrical Conductivity Measurements* 118 (4): 669–672.

Choong et al, Molecular parameters and lithographic performance of poly(chloromethylstyrene)–a high–performance negative electron resist, *J. Vac. Sci. Technol.* 19(4), Nov./Dec. 1981: 1121–1126.

Shaw et al, Performance Characteristics of Diazo–Type Photoresists Under e–Beam and Optical Exposure, *IEEE Transactions on Electron Devices* ED–25(4), Apr. 1978: 425–430.

Tanenbaum et al, High resolution electron beam lithography using ZEP–520 and KRS resists at low voltage, *J. Vac. Sci. Technol.* B 14(6), Nov./Dec. 1996: 3829–3833.

Daly et al, Negative–working e–beam copolymers, *SPIE 539 Advances in Resist Technology and Processing II*, 1985: 138–144.

Liutkus et al, Poly–4–Chlorostyrene, a New High Contrast Negative E–Beam Resist, *SPE Reg. Tech. Conf.*, Ellenville, NY, 1982: 223–230.

Feely et al, The Role of the Latent Image in a New Dual Image, Aqueous Developable, Thermally Stable Photoresist, *Proceedings of the 7th International Conference on Photopolymers, SPE 49*, 1985: 49–64.

Reiser, Photoreactive Polymers, *The Science and Technology of Resists*, John Wiley & Sons, NY, 1989: 22, 258 and 311.

Lee et al, Electron Beam Chemistry of Poly(4–Vinyl Pyridine) and its Quaternized Salts, *Polymer Bulletin 10*, 1983: 39–44.

Taniguchi et al, PGMA as a High Resolution High Sensitivity Negative Electron Beam Resist, *Japanese Journal of Applied Physics* 18(6), Jun. 1979: 1143–1148.

Tan et al, Novel, Negative–Working Electron–Beam Resist, *Proc. SPIE 469*135, 1984.

* cited by examiner

*Primary Examiner*—John S. Chu
(74) *Attorney, Agent, or Firm*—Connolly Bove Lodge & Hutz, LLP; Daniel P. Morris

(57) ABSTRACT

A new group of non-chemically amplified negative tone water/aqueous base developable (photo) resists based on redistribution of carbon-oxygen bonds in pendant ester groups of the polymers has been found.

21 Claims, 3 Drawing Sheets

FORMING A PATTERN OF A NEGATIVE PHOTORESIST

CROSS REFERENCE TO RELATED APPLICATION

This is a divisional application of prior U.S. patent application Ser. No. 09/373,555, filed Aug. 3, 1999, now U.S. Pat. No. 6,251,569 B1.

TECHNICAL FIELD

The present invention relates to producing resist images employing compositions that act as negative photoresists. The present invention also relates to the resist images. The compositions according to the present invention do not require any additional photocatalysts, photoinitiators or added crosslinking agents. The negative photoresists are developable in water or an aqueous based composition.

BACKGROUND ART

One widely used method for forming a pattern such as metallic circuitry on a substrate in the manufacture of printed circuit boards in integrated circuits is to imagewise form a pattern of photoresist material over those areas of the substrate or over a metal-coated substrate to be shielded from metal deposition or metal removal. The photoresist layer is normally formed of a polymeric, organic material that is substantially unaffected by the metal deposition or metal removal process and, accordingly, protects the underlying areas.

The pattern is formed by imagewise exposing the photoresist material to irradiation through a photographic image, such as a glass master, by photolithographic techniques. The irradiations employed is usually X-ray, UV radiation, or electron beam radiation.

Photosensitive materials and/or compositions are either positive-acting (i.e. photosolubilizable) or negative-acting (i.e. photoinsolubilizable or photocrosslinkable). Positive-working (photo)sensitive compositions are rendered soluble (or developable) by actinic radiation (deep-near UV, x-ray or electron-beam) and can be removed using selective developing solutions leaving unexposed areas intact. Negative-working (photo)sensitive compositions are those which become insoluble upon exposure to actinic radiation. Selected solutions can dissolve and remove the unexposed areas of the composition while leaving the exposed portions intact. Development of such exposed materials yields negative tone images.

The majority of contemporary (photo)resist compositions for deep UV and e-beam applications are based on the principle of chemical amplification and consist of polymer matrixes, photoacid generators (PAG's) and crosslinkers (for negative tone image generation). Photoacid generating onium salts are well known in the field of (photo) lithography. Useful (photo)catalysts include, for example, complexes of metal halides or salts of strong acids such as tetrafluoroborates, hexafluoroantimonates, and trifluorometanesulfonates, triphenylsulfonium triflate being an example; iodonium compounds such as t-butyl phenyl iodonium camphor sulfonate; hexafluoroarsenates and hexafluorophosphates. Although such (photo)resists show high (photo)speed and high resolution they develop some very serious lithographic and processing problems such as PAG diffusion (especially at high post-exposure bake temperatures, about 160° C. used to process them), acid outgassing during exposure, very high sensitivity to airborne contamination by aminocompounds such as N-methylpyrrolidinone, contamination of coat tracks and masks, process time delay dependence and limited shelf life.

Reiser (see, "Photoreactive Polymers. The Science and Technology of Resists", p. 22, p. 258, p. 311, John Wiley & Sons, NY (1989)) describes the background of negative tone (photo)resist materials which are based on the principle of photoinduced polarity changes in polymer-bound functional groups such as poly(vinyl cinnamate), poly(vinyl cinnamylide acetate), chalcones, phenyldiacrylates attached by an esterlinkage to poly(vinyl alcohol) or incorporated in the backbone of a polyester as well as methacrylic copolymers with dimethylmaleimide or diphenylcyclopropene pendant chromophore groups; negative resists based on nitrene chemistry which are prepared by attaching azido groups to a polymer chain; systems based on bis-azides or 4-azidochalcones. Negative systems based on macroradical coupling reactions (photocrosslinking of copolymers containing benzophenone and p-dimethylamino-phenyl groups) as well as negative tone resists based on photoinduced polarity change are also discussed.

W. E. Feely et al., (see Proceedings of the 7th International Conference on Photopolymers, SPE, 49 (1985)) discusses the use of melamine crosslinkers to form negative tone images without the use of photocatalysts.

U.S. Pat. No. 4,284,707 describes negative working material based on crosslinking of two copolymers without onium salts.

U.S. Pat. No. 4,603,195 (1986) describes negative tone organosilicon photoresist based on 2,1,5-naphthoquinone diazo chemistry. Also J. M. Shaw and M. Hatzakis demonstrated that some commercial positive tone novolac photoresists based on diazoquinone chemistry work as negative tone base developable e-beam resists with high resolution and sensitivity (see J. M. Shaw and M. Hatzakis, IEEE Trans. Electron Devices, vol. ED-25, 425 (1978)).

Negative tone e-beam resists have been developed on the basis of polymeric materials containing glycidyl methacrylate units (see T. Hiraeti et al. J. Electrochem. Soc., vol. 118, 669 (1971); Y. Taniguchi et al., J. Appl. Phys. vol. 18, 1143 (1979); L. F. Thompson et al. J. Vac. Sci. Technol. vol. 12, 1280 (1975)).

Copolymers of allyl- and propargyl methacrylates with 2-hydroxyethylmethacrylate have been found to work as sensitive negative tone e-beam resist materials (see Z. C. H. Tan et al., Proc. SPIE, vol. 461, 135 (1984) and R. C. Daly et al., Proc. SPIE, vol. 539, 138 (1985)).

A series of relatively effective negative tone solvent developable e-beam resists with a good plasma stability was developed using polystyrene type copolymers containing chloro-, iodo- or chloromethyl groups in the p-position in aromatic ring (see J. Luitkis et al., SPE Reg. Tech. Conf., Ellenville, N.Y., p. 223 (1982); H. S. Choong et al., J. Vac. Sci. Technol. vol. 19, 1121 (1981)). Similar results are achievable by quarternization of poly(vinyl pyridine) with methyl iodide (see K. I. Lee et al., Polym. Bull., vol. 10, 39 (1983)).

Some other examples of negative tone deep UV resists are as follows:

CGR-chemically amplified resist based on poly(p-hydroxystyrene)or its copolymers with styrene or vinylcyclohexane with powderlink crosslinker and a PAG.

SNR-(Shipley Negative Resist) is based on poly(p-hydroxystyrene), a melamine crosslinker and a PAG.

ZEP-520 and ZEP-7000 are conventional chain scission positive tone solvent developable resist formulations (Nippon Zeon Co., Ltd.).

KRS is a chemically amplified positive tone resist based on ketal chemistry (see O. M. Tanenbaum et al., J. Vac. Sci. Technol. B 14(6), 3829 (1996)).

Even though a number of photoresist materials are known and are capable of forming desired masking patterning providing negative tone compositions which exhibit acceptable imaging (resolution and sensitivity) characteristics to be suitable as an image or pattern mask, especially for integrated circuits, along with being developable in water and being not chemically amplified is quite unusual. As discussed above, various problems are encountered with chemically amplified photoresists including certain contamination damages, process time delay dependence and limited shelf life.

SUMMARY OF THE INVENTION

The present invention provides for achieving a patterned negative tone photoresist without requiring any additional photocatalysts or photoinitiators. Moreover, the present invention makes it possible to fabricate a patterned negative tone photoresist without requiring the addition of individual polyfunctional compounds acting as crosslinking agents.

The present invention provides for fabricating a patterned negative photoresist engaging certain materials that contain a component that permits crosslinking. The present invention makes it possible to employ non-chemically amplified materials.

In particular, the present invention relates to a method for forming a pattern of a negative photoresist which comprises:
a) providing on a substrate a layer of a negative photoresist composition comprising a polymer having at least one recurring group represented by the formula 1:

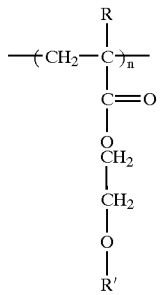

wherein
R=H, CH$_3$—, alkyl-, or —CH$_2$SiMe$_3$;
R'=—(CH$_2$CH$_2$O)$_m$R",
-alkyl, cycloalkyl, or aryl, wherein R" is alkyl, cycloalkyl or aryl; and wherein typically m is an integer of 1 to about 10 and n is typically an integer of 5 to about 10$^4$;

b. imagewise exposing the layer to irradiation; and
C. developing the photoresist by removing portions of the layer not exposed to thereby form the pattern.

The present invention also relates to the patterned negative photoresist obtained by the above process.

Another aspect of the present invention relates to a structure comprising a substrate and a layer of a patterned negative photoresist on the substrate wherein the patterned negative photoresist is obtained by crosslinking a polymer having at least one recurring group represented by the formula 1 above.

DESCRIPTION OF BEST AND VARIOUS MODES FOR CARRYING OUT INVENTION

Figure 1:
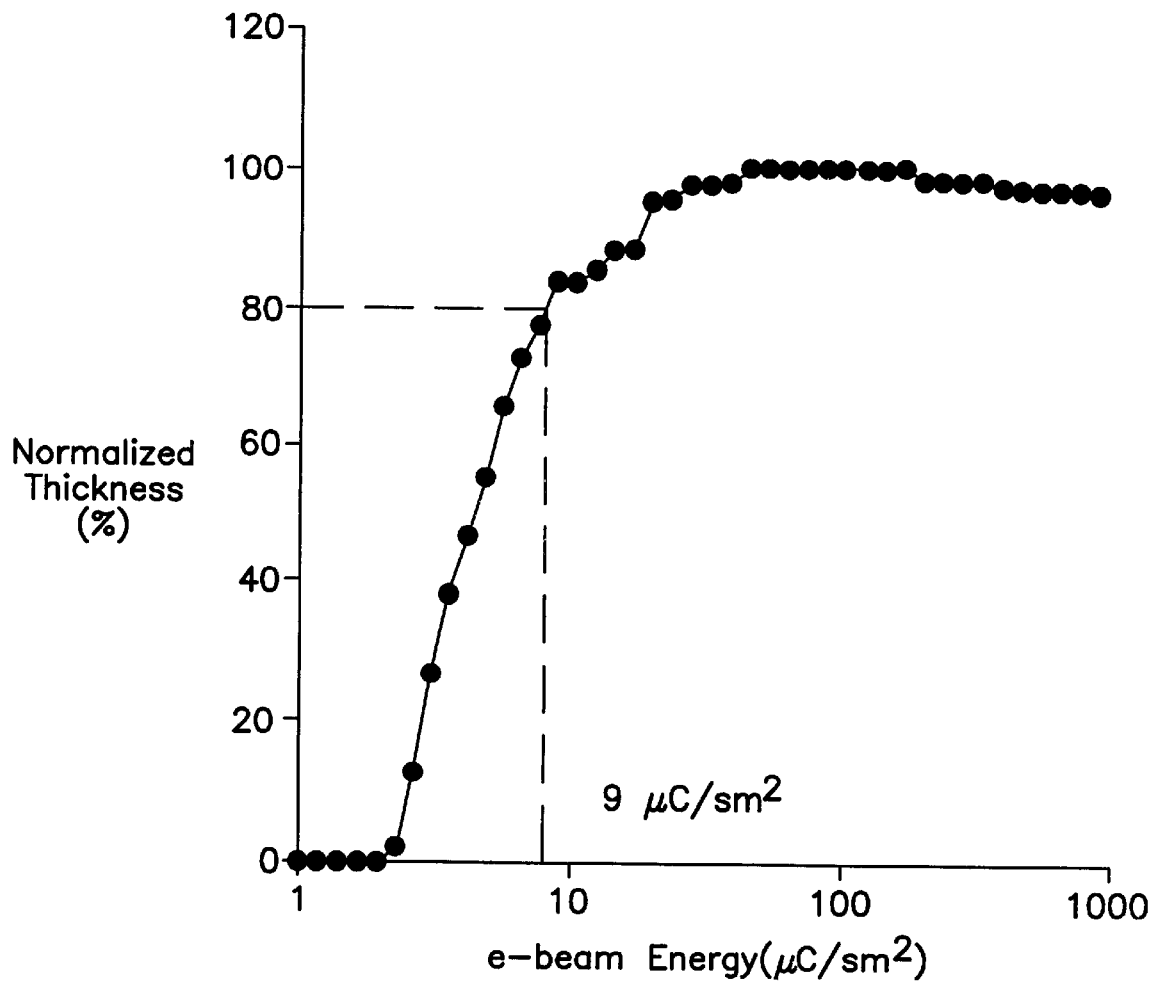
FIG. 1 is a sensitivity curve for a poly (methoxyethoxyethyl methacrylate) film (0.3 um) at 50 KeV; after e-beam exposure baked at 100 EC for 4 minutes and developed in water for 20 seconds.

It has been found according to the present invention that certain polymers can be used as negative photoresists and are highly sensitive to irradiation including deep UV, e-beam and x-ray irradiation and allow for the formation of submicron images developable in water or aqueous base.

Polymers employed according to the present invention comprise at least one recurring group represent by the formula 1:

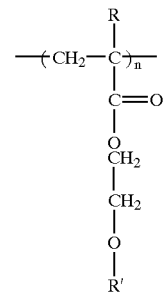

wherein
R=H, CH$_3$—, alkyl-, or —CH$_2$SiMe$_3$;
R'=—(CH$_2$CH$_2$O)$_m$R";
alkyl, cycloalkyl, or aryl; and wherein R" is alkyl, cycloalkyl or aryl; and wherein typically m is an integer of 1 to about 10, preferably 1 to about 5, and more preferably 1 to about 3; and n is typically an integer of 5 to about 10$^4$, preferably about 10 to about 5000, and more preferably about 100 to about 3000.

Examples of suitable copolymers to employ according to the present invention are represented by the formula 2:

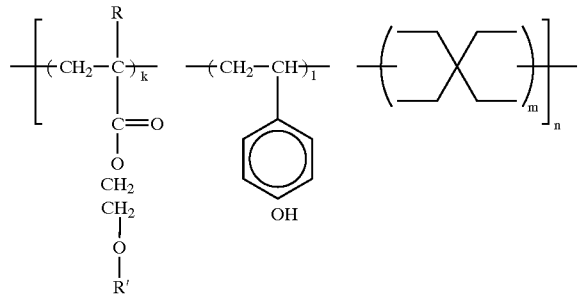

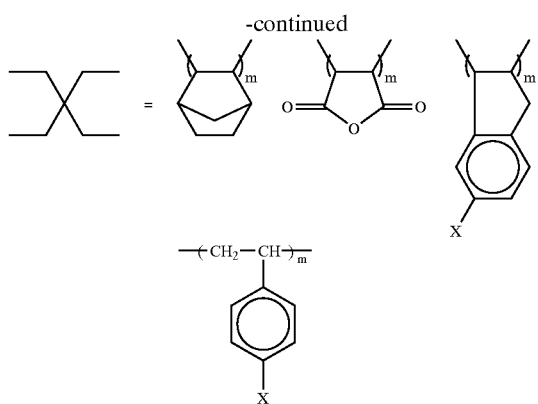

X=H, Cl and other functional groups including:

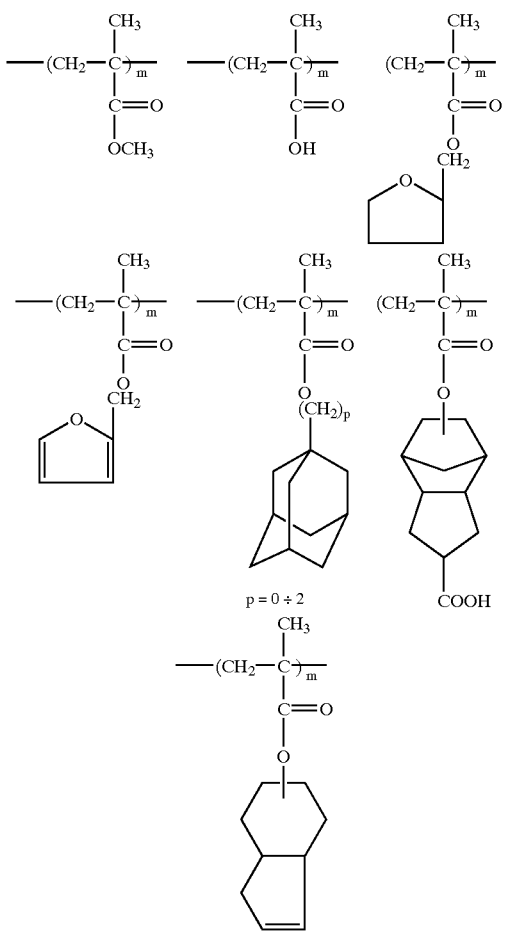

and wherein R, R", R'" and n have the same meanings as discussed above for formula 1; k is typically an integer of about 0.1 to about 0.6; preferably about 0.15 to about 0.5, and more preferably about 0.2 to about 0.4; l is typically an integer of about 0.1 to about 0.6; preferably about 0.15 to about 0.5 and more preferably about 0.2 to about 0.4; and m is typically an integer of about 0.1 to about 0.6, preferably about 0.15 to about 0.5, and more preferably about 0.2 to about 0.4. k+l+m=1.

The alkyl groups in the above formulas 1 and 2 typically contain 1 to 12 carbon atoms, preferably 1 to 3 carbon atoms and most preferably 1 to 2 carbon atoms. Examples of suitable alkyl groups are methyl, ethyl, butyl, isopropyl, isobutyl, tert.-butyl, neopentyl, and dodecyl.

The aryl groups in the above formulas 1 and 2 typically contain 6 to 13 carbon atoms and preferably 6 to 10 carbon atoms, an example of which being phenyl.

The cycloalkyl group in the above formulas 1 and 2 typically contain 3 to 12 carbon atoms and preferably 3 to 10 carbon atoms. Examples of cycloalkyl groups are cyclobutyl, cyclopentyl and cyclohexyl.

The polymers and copolymers employed according to the present invention typically have weight average molecular weight of at least about 20,000; more typically weight average molecular weight of about 20,000 to about 1,000,000, an example being about 60,000. The polymers and copolymers employed also typically include at least about 5 molar % of the recurring groups represented by formula 1 and more typically about 10 to about 60 molar % and preferably about 20 to about 40 molar %.

It is believed that the polymers employed according to the present invention upon irradiation result in redistribution of carbon-oxygen bonds in the side ester groups leading to the formation of ester type bridges between polymer chains thereby resulting in crosslinking.

Homopolymers containing recurring groups represented by formula 1 can be prepared by radical or anionic polymerization of acrylic or methacrylic type monomers containing long chain ester side groups such as methoxyethoxyethyl methacrylate, ethoxyethoxyethyl methacrylate, phenoxyethyl methacrylate, cyclohexyloxyethyl methacrylate and its analogues.

Copolymers containing recurring groups represented by formula 1 can be prepared by radical or anionic copolymerization of acrylic/methacrylic monomers containing long chain ester side groups described above with different monomers such as indene and styrene and its functional derivatives (for example, p-hydroxystyrene, p-acetoxystyrene, p-nitrostyrene, p-chlorostyrene and the like); copolymerization with norbornene and norbornadiene and their functional derivatives (for example, 5-norbornene-2,3-dicarboxylic anhydride, 5-norbornene-2,3-dicarobxylic acid, 7-norbornadienyl benzoate and the like); copolymerization with maleic anhydride; copolymerization with methacrylic monomers containing alicyclic, polycyclic or aromatic groups including functional derivatives (for example, methacrylic acid, methyl methacrylate, isobornyl methacrylate, furyl methacrylate, tetrahydrofuryl methacrylate, adamantanemethacrylate, dicyclopentenyl methacrylate, 8-hydroxycarbonyltricyclo (5,2,1,0$^{2,6}$) decanyl methacrylate, 4-methacryloxyethyl trimellitic anhydride, 4-methacryloxy-2-hydroxybenzophenone, p-hydroxymethacrylamide and the like).

Copolymerization with above mentioned comonomers makes it possible to adjust critical photoresist properties such as sensitivity to deep UV, e-beam or x-ray irradiation, dissolution rates in water or aqueous base solutions, glass transition temperatures, thermal stability, stability in chlorinated plasmas.

Well-known photochemical reactions of polymethacrylates with short ester side groups (see scheme 1 below, for example, poly(methyl methacrylate)) and some functional derivatives (see scheme 2 below e.g., poly(2-hydroxyethyl methacrylate) result in positive tone (photo)resist materials. One includes a scission of carbon-carbon bonds in the main chain (Scheme 1) leading to the formation of low molecular weight oligomers. Another one (scheme 2) leads to the formation of carboxylic acid units due to the rearrangement of side groups which makes the exposed areas of such polymeric material soluble in aqueous base.

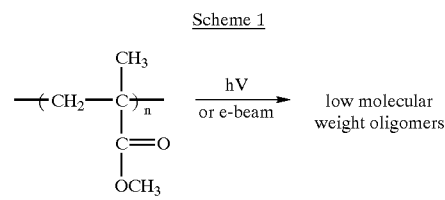

Scheme 1

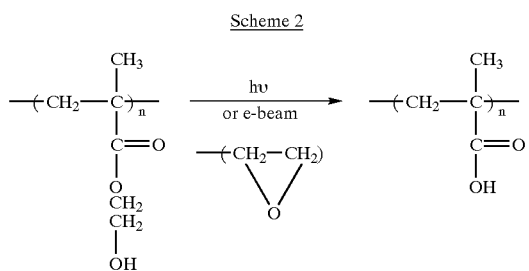

Scheme 2

On the other hand, the present invention surprisingly provides heat stable negative tone compositions without requiring the addition of photocatalysts (photoacid or photobase generators) and based on the photosensitivity of pendant ester side groups in the polymers and copolymers represented by formulas 1 and 2, above.

The negative tone compositions of the present invention are stable at room temperatures, i.e. the compositions are capable of being stored for a long time before use. Such a good shelf life is due to the fact that the compositions of the present invention are not thermosetting.

Copolymerization of monomers of formula 1 such as methoxyethoxyethyl methacrylate with a silicon containing methacrylate such as tris(trimethylsiloxy)silylpropyl methacrylate and styrene type comonomers makes possible the preparation of radiation sensitive materials with high silicon content useful for double layer lithographic applications which form negative tone images upon irradiation and development and can be used for pattern transfer to the thick bottom layer by means of oxygen plasmas (see scheme 3 shown below).

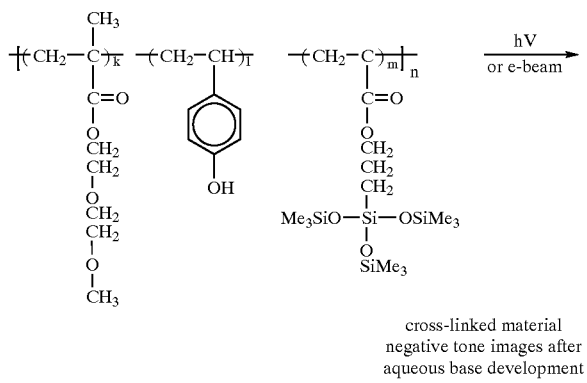

cross-linked material
negative tone images after
aqueous base development

The negative tone photoresists according to the present invention can be developed into metal-ion-free aqueous based compositions comprising surface active agents or water.

The follow non-limiting examples are presented to further illustrate the present invention.

EXAMPLE 1

Methoxyethoxyethyl methacrylate was polymerized in a tetrahydrofuran (THF) solution using 0.5% wt. of 2,2'-azobis-iso-butyronitirle (AiBN) as a radical initiator for about 17 hrs. at about 65 EC. Poly(methoxyethoxyethyl methacrylate) was precipitated in hexane, dried in a vacuum oven at about 60 EC for about 5 hrs., dissolved in cyclohexanone, filtered to 0.2 micron, spin-coated on a silicon wafer at 2000–3000 rpm to form 0.3–0.5 micron thick film, post-apply baked (PEB) at about 100EC for about 3 min. and exposed to e-beam irradiation at about 25 or about 50 KeV or to deep UV irradiation (193 nm or 248 nm). The exposed wafer was post-exposure baked at about 100 EC for about 5 min., cooled to room temperature and developed in pure water for about 15–45 sec. to form negative tone images with fine line resolution below 1 micron. Sensitivity of the material prepared in Example 1 at 50 KeV was found to be about 9 $\mu$C/sq.cm (see FIG. 1).

EXAMPLE 2

A copolymer of methoxyethoxyethyl methacrylate and methyl methacrylate (15% mol) prepared as described in Example 1 works as a negative tone water developable e-beam and deep UV (photo)resist. Its e-beam sensitivity at 50 KeV is about 21 $\mu$C/sq.cm.

EXAMPLE 3

Figure 2:
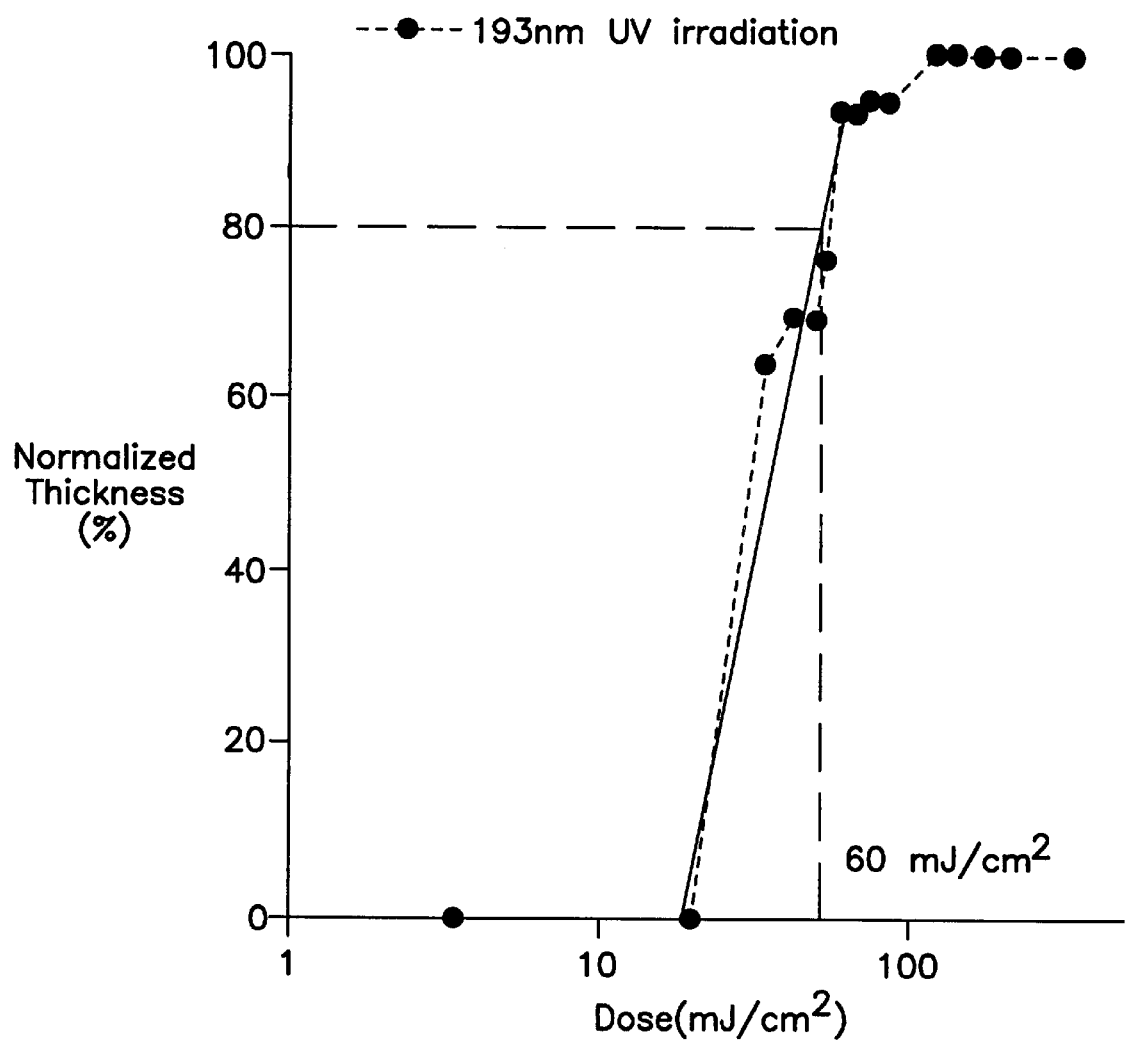
FIG. 2 is a sensitivity curve for a copolymer used according to the present invention exposed to deep UV irradiation (193 nm) and developed in aqueous base.

A terpolymer of methoxyethoxyethyl methacrylate (43% mol.), tetrahydrofuryl methacrylate (41.5% mol.) and 4-methacryloxyethyl trimellitic anhydride (15.5% mol.) was prepared as described in Example 1. When exposed to 193 nm deep UV light it forms negative tone images after PEB at about 100 EC for about 4 min. and development in diluted based solution. The sensitivity is about 55 mJ/sq.cm. (see FIG. 2).

EXAMPLE 4

Methoxyethoxyethyl methacrylate was copolymerized with 4-methacryloxyethyl trimellitic anhydride (10% mol.) as described in Example 1. Upon exposure to deep UV or e-beam irradiation it forms negative tone images after PEB at about 100 EC (4 min.) and development in dilute aqueous base (3 ml 0.14 N standard TMAH developer+777 ml of water). Its sensitivity to 248 nm deep UV irradiation is about 90 mJ/sq. com. The e-beam sensitivity was about 15 $\mu$C/sq.cm. at 50 KeV.

EXAMPLE 5

Methoxyethoxyethyl methacrylate (90% mol.) was copolymerized with methacrylic acid (10% mol.) as described in Example 1 using 4% wt. of AiBN. This copolymer works as a negative tone aqueous base developable deep UV and e-beam resist.

EXAMPLE 6

Methoxyethoxyethyl methacrylate (95% mol.) was copolymerized with 2-acrylamido-2-methyl-1-propanesulfonic acid (5% mol.) as described in Example 1. Negative tone images are developable in aqueous base after e-beam irradiation.

EXAMPLE 7

A terpolymer of methoxyethoxyethyl methacrylate (58% mol.), 4-methacryloxyethyl trimellitic anhydride (19% mol.)

and dicyclopentenyl methacrylate (23% mol.) was prepared-as described in Example 1. A 0.3 micron thick film exposed to e-beam irradiation at 50 KeV forms a negative tone image after development in a dilute base (see Example 4). Its sensitivity is about 28 μC/sq.cm. Negative tone images are also developable in a mixture of methyl-iso-butyl ketone (MIBK)/iso-propyl alcohol (IPA) 1:4.

Sensitivity for the terpolymer based on 60% mol.:15% mol.:25% mol. ratio of the same monomers is about 24 μC/sq.cm. Sensitivity of this copolymer to 193 nm deep UV irradiation is about 150 mJ/sq.cm.

EXAMPLE 8

Figure 3A:
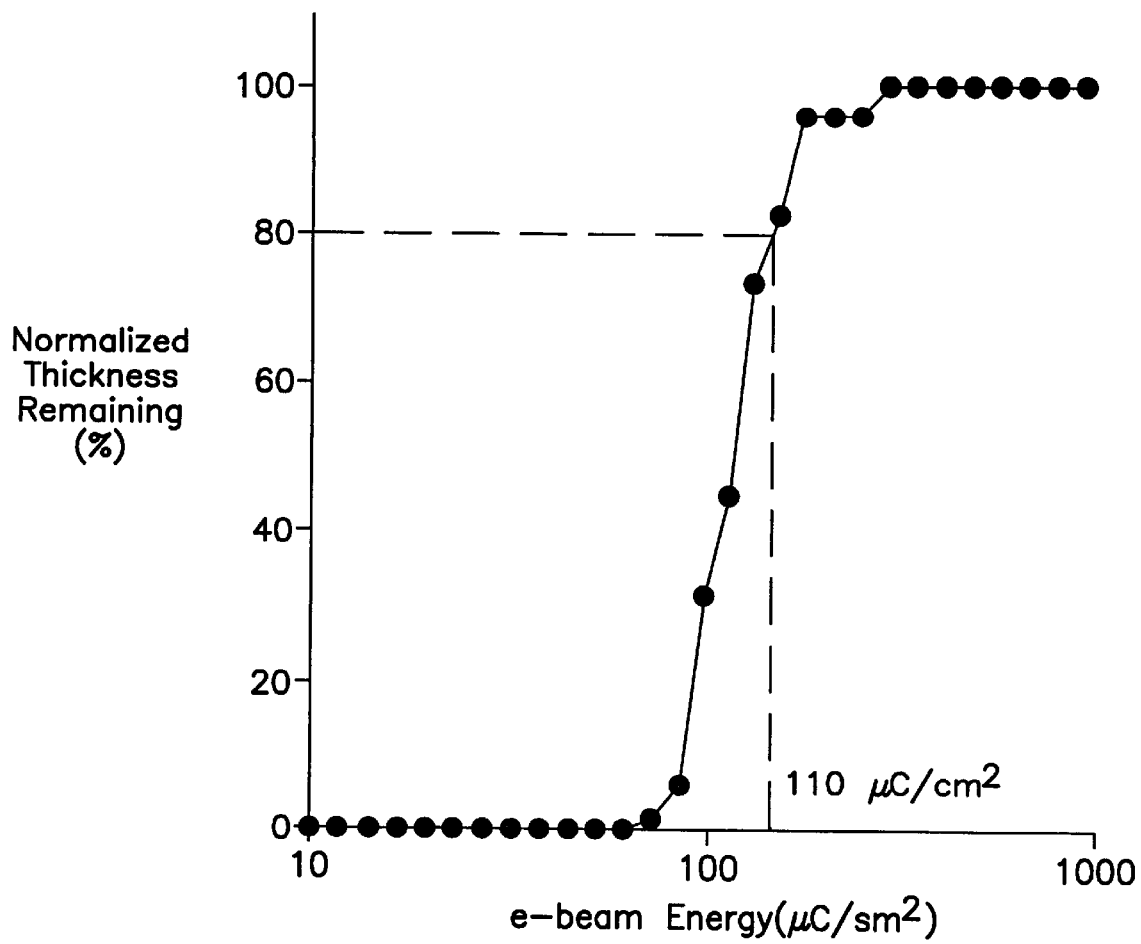
FIG. 3 is a sensitivity curve for a copolymer used according to the present invention exposed to e-beam irradiation at 50 KeV and developed in aqueous base.
Figure 3B:
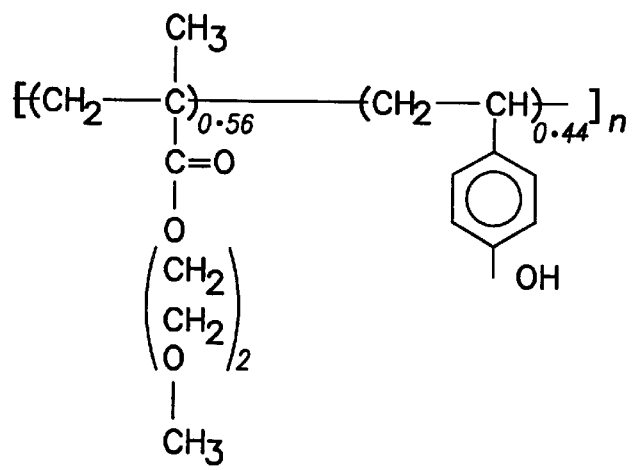

A copolymer of methoxyethoxyethyl methacrylate (56% mol.) with p-hydroxystyrene (44% mol.) was prepared as described in Example 1. A 0.3 micron film exposed to e-beam irradiation at 50 KeV forms a negative tone submicron image (FIG. 3) after usual PEB and development in a dilute aqueous base (see Example 4). Its sensitivity is about 93 μC/sq.cm. Sensitivity of this termpolymer to 193 nm deep UV irradiation is about 180 mJ/sq.cm.

EXAMPLE 9

A copolymer of methoxyethoxyethyl methacrylate (80% mol.) with styrene (20% mol.) was prepared as described in Example 1 using 1% wt. of AiBN and a mixture of THF and cyclohexanone as solvents.

E-beam sensitivity of this copolymer at 25 KeV was about 110 μC/sq.sm; negative tone images have been developed in aqueous base.

EXAMPLE 10

Methoxyethoxyethyl methacrylate (70% mol.) was copolymerized with p-acetoxystyrene (30% mol.) as described in Example 7. Negative tone images have been developed in aqueous base. E-beam sensitivity of this copolymer at 25 KeV was about 110 μC/sq.cm.

EXAMPLE 11

The copolymer of Example 8 was hydrolyzed in THF: acetone solution (5:1) using concentrated ammonia (about 40 g per 20 g of the copolymer) for 36 hrs at room temperature. Substitution of acetoxy groups by hydroxy groups was controlled by IR analysis. After the completion of hydrolysis solvent have been removed under vacuum. Copolymer was precipitated in methanol, separated and dried in vacuum at 60EC. E-beam sensitivity of this copolymer at 25 KeV was found to about 110 μC/sq.cm.

EXAMPLE 12

Methoxyethoxyethyl methacrylate (70% mol.) was copolymerized with p-hydroxyphenyl methacrylamide (30% mol.) as described in Example 1. The copolymer was sensitive to deep UV and e-beam irradiation. Negative tone images are developable in aqueous base.

EXAMPLE 13

Methoxyethoxyethyl methacrylate (54% mol.) was copolymerized with 2-bromoethyl methacrylate using 0.5% wt. of AiBN in THF/cyclohexanone solution as described in Example 1. E-beam sensitivity of this copolymer at 25 KeV was about 20 μC/sq.cm. Negative tone images have been developed in a dilute aqueous base solution.

EXAMPLE 14

Methoxyethoxyethyl methacrylate was copolymerized with 1-adamantane methacrylate (30% mol., prepared from 1-adamantanol and methacryloyl chloride) as described in Example 1. This copolymer forms negative tone images after exposure to deep UV or e-beam irradiation developable in aqueous base.

EXAMPLE 15

Methoxyethoxyethyl methacrylate (50% mol.) was copolymerized with norbornene (20% mol.), maleic anhydride (20% mol.) and methacrylic acid (10% mol.) as described in Example 1. Negative tone images after deep UV or e-beam exposures have been developed in aqueous base.

EXAMPLE 16

Methoxyethoxyethyl methacrylate was copolymerized with tris(trimethylsiloxy) silylpropyl methacrylate (50% mol.) as described in Example 1. This copolymer forms negative tone images after deep UV (193 nm) or e-beam irradiation which are developable in dilute aqueous base. Its e-beam sensitivity at 50 KeV is about 36 $\mu C/cm^2$.

EXAMPLE 17

Phenoxyethyl methacrylate was copolymerized with methacrylic acid (10% mol.) as described in Example 1. This copolymer is sensitive to deep UV and e-beam irradiation. Negative tone images are developable in a standard aqueous developer CD-26 in about 15 sec. CD-26 is a commercially available developer from Shipley and is a 0.26 N solution of tetramethylammonium hydroxide.

What is claimed is:

1. A structure comprising a substrate and a layer of a patterned negative photoresist on the substrate wherein the patterned negative photoresist is obtained by crosslinking a polymer having at least one recurring group represented by the formula 1:

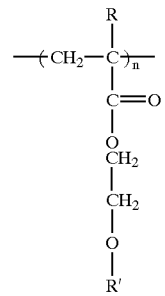

wherein R is selected from the group consisting of H, $CH_3$, alkyl, and $CH_2Si(CH_3)_3$;

R' is selected from the groups consisting of

—$(CH_2CH_2O)_mR''$, alkyl, cycloalkyl and aryl, wherein m is an integer of about 1 to about 10; R" is alkyl, cycloalkyl or aryl; wherein n is an integer of about 5 to about $10^4$.

2. The structure of claim 1 wherein the polymer has a weight average molecular weight of at least about 20,000.

3. The structure of claim 2 wherein the polymer has a weight average molecular weight of about 20,000 to about 1,000,000.

4. The structure of claim 2 wherein the polymer contains at least about 5 molar % of the recurring group of formula 1.

5. The structure of claim 2 wherein the polymer comprises at least one copolymer selected from the group consisting of methoxyethoxyethyl methacrylate, ethoxyethoxy ethyl methacrylate, phenoxyethyl methacrylate and cyclohexyloxyethyl methacrylate.

6. The structure of claim 2 wherein the polymer comprises at least one copolymer represented by formula 2:

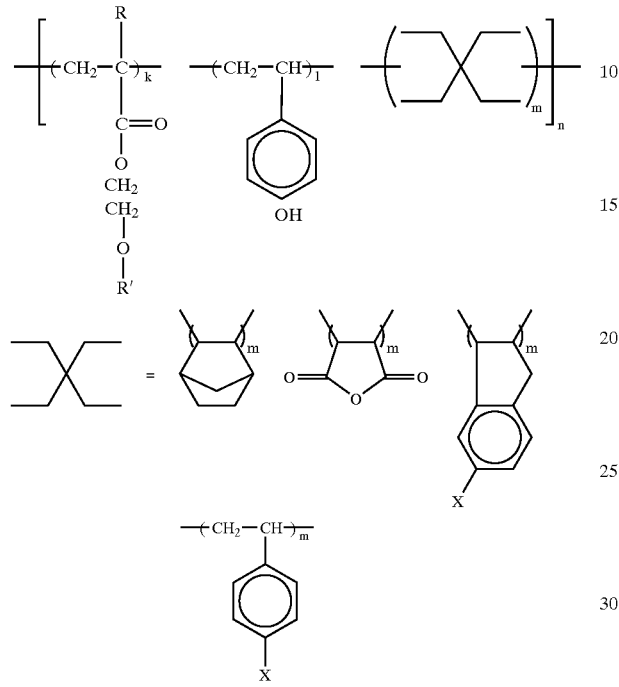

X=H, Cl and comonomeric groups selected from the group consisting of:

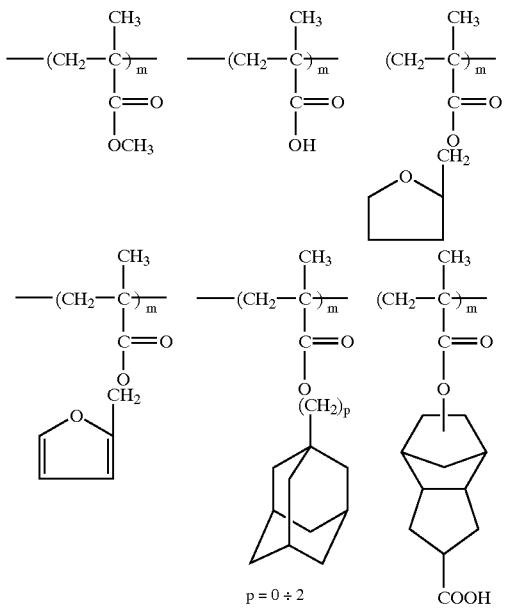

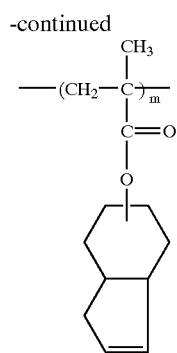

wherein m is an integer of about 0.2 to about 0.4, k is an integer of about 0.2 to about 0.4, and 1l is an integer of about 0.2 to about 0.4, and k+1l+m=1.

7. The structure of claim 6 wherein the copolymer comprises a silicon containing methacrylate.

8. The structure of claim 6 wherein the copolymer comprises a copolymer of methoxyethoxyethyl methacrylate and methyl methacrylate.

9. The structure of claim 6 wherein the copolymer comprises a copolymer of methoxyethoxyethyl methacrylate, tetrahydrofuryl methacrylate and 4-methacryloxyethyl trimellitic anhydride.

10. The structure of claim 6 wherein the copolymer comprises a copolymer of methoxyethoxyethyl methacrylate and 4-methacryloxyethyl trimellitic anhydride.

11. The structure of claim 6 wherein the copolymer comprises a copolymer of methoxyethoxyethyl methacrylate and 2-acrylamide-2-methyl-1-propanesulfonic acid.

12. The structure of claim 6 wherein the copolymer comprises a copolymer of methoxyethoxyethyl methacrylate, 4-methacryloxy-ethyl trimellitic anhydride and dicyclopentenyl methacrylate.

13. The structure of claim 6 wherein the copolymer comprises a copolymer of methoxyethoxyethyl methacrylate and p-hydroxystyrene.

14. The structure of claim 6 wherein the copolymer comprises a copolymer of methoxyethoxyethyl methacrylate and styrene.

15. The structure of claim 6 wherein the copolymer comprises a copolymer of methoxyethoxyethyl methacrylate and p-acetoxystyrene.

16. The structure of claim 6 wherein the copolymer comprises a copolymers of methoxyethoxyethyl methacrylate and p-hydroxyphenyl methacrylamide.

17. The structure of claim 6 wherein the copolymer comprises a copolymer comprises a copolymer of methoxyethoxyethyl methacrylate and 2-bromoethyl methac-rylate.

18. The structure of claim 6 wherein the copolymer comprises a copolymer of the methoxyethoxyethyl methacrylate and 1-adamantane methacrylate.

19. The structure of claim 6 wherein the copolymer comprises a copolymer of methoxyethoxyethyl methacrylate and orbornene.

20. The structure of claim 6 wherein the copolymer comprises a copolymer of methoxyethoxy-ethyl methacrylate and tris(trimethyl siloxy) silylpropyl methacrylate.

21. The structure of claim 6 wherein the copolymer comprises a copolymer of phenoxyethyl methacrylate and methacrylic acid.

* * * * *